United States Patent
Watanabe

(10) Patent No.: US 6,498,051 B1
(45) Date of Patent: Dec. 24, 2002

(54) METHOD OF PACKAGING SEMICONDUCTOR DEVICE USING ANISOTROPIC CONDUCTIVE ADHESIVE

(75) Inventor: Makoto Watanabe, Tokorozawa (JP)

(73) Assignee: Citizen Watch Co., Ltd., Nishitokyo (JP)

( * ) Notice: Subject to any disclaimer, the term of this patent is extended or adjusted under 35 U.S.C. 154(b) by 0 days.

(21) Appl. No.: 09/646,964

(22) PCT Filed: Jan. 27, 2000

(86) PCT No.: PCT/JP00/00420

§ 371 (c)(1),
(2), (4) Date: Sep. 25, 2000

(87) PCT Pub. No.: WO00/45431

PCT Pub. Date: Aug. 3, 2000

(30) Foreign Application Priority Data

Jan. 27, 1999 (JP) .............................................. 11-18487

(51) Int. Cl.$^7$ ............................................... H01L 21/44
(52) U.S. Cl. ....................... 438/106; 438/121; 438/122; 438/123; 438/124; 438/125; 257/704
(58) Field of Search ................................. 438/106, 121, 438/122, 123, 124, 125; 257/704

(56) References Cited

U.S. PATENT DOCUMENTS 5,631,191 A * 5/1997 Durand et al. .............. 437/206
5,810,959 A * 9/1998 Tanaka et al. ............ 156/275.5
5,943,558 A * 8/1999 Kim et al. .................. 438/125

FOREIGN PATENT DOCUMENTS

| EP | 0 708 582 A1 | 4/1996 |
| JP | 61-97837 | 6/1986 |
| JP | 09-219579 | 8/1997 |
| JP | 10-032380 | 2/1998 |
| JP | 10-289929 | 10/1998 |

OTHER PUBLICATIONS

European Search Report dated Sep. 12, 2001.

* cited by examiner

*Primary Examiner*—Long Pham
*Assistant Examiner*—Khiem Nguyen
(74) *Attorney, Agent, or Firm*—Armstrong, Westerman & Hattori, LLP

(57) ABSTRACT

A method of mounting a semiconductor device (16) comprises the steps of disposing an anisotropic conductive adhesive (13) on the surface of a circuit board (17), placing the semiconductor device (16) on the surface of the circuit board (17) after aligning bumps (14) provided on the semiconductor device (16) with wiring patterns (15) formed on the surface of the circuit board (17), respectively, provisionally press-bonding the semiconductor device (16) onto the circuit board (17) by heating at a temperature lower than the curing temperature of an adhesive resin (11) of the anisotropic conductive adhesive (13) while applying a predetermined pressure thereto by use of a heating and pressurizing tool (18), and thereafter bonding the semiconductor device (16), as provisionally press-bonded, onto the circuit board (17) by heating and curing the adhesive resin (11) at a temperature causing the same to be cured.

6 Claims, 6 Drawing Sheets

METHOD OF PACKAGING SEMICONDUCTOR DEVICE USING ANISOTROPIC CONDUCTIVE ADHESIVE

TECHNICAL FIELD

The present invention relates to a method of mounting a semiconductor device whereby the semiconductor device is connected with, and fixed to the surface of a circuit board with the use of an anisotropic conductive adhesive.

BACKGROUND TECHNOLOGY

A method of mounting a semiconductor device whereby the semiconductor device is connected with, and fixed to the surface of a circuit board with the use of an anisotropic conductive adhesive has been put to practical use. The conventional method of mounting a semiconductor device is described hereinafter with reference to FIGS. 11 to 16.

FIGS. 11 to 14 are sectional views showing respective steps of the conventional method of mounting the semiconductor device. As shown in these figures, with the conventional method of mounting the semiconductor device, wiring patterns 15 provided on a circuit board 17 are connected with bumps 14 formed on a semiconductor device 16, respectively. When making such a connection, conductive particles 12 having electric conductivity, contained in an anisotropic conductive adhesive 13, are sandwiched between the respective wiring patterns 15 and the respective bumps 14, thereby effecting electric conduction therebetween by the agency of the conductive particles 12.

The anisotropic conductive adhesive 13 is composed of the conductive particles 12 which are mixed in an adhesive resin 11 of a thermosetting type, made of an epoxy based adhesive, so as to have electric conductivity, and is formed in a film-like shape on a base film while being protected by a cover film. The conductive particles 12 are metallic particles made of silver, solder, or so forth, 5 to 10 μm in diameter, or composed of resin particles made of a plastic, with gold (Au) plating applied on the surface thereof.

The circuit board 17 is provided with the wiring patterns 15 formed on a substrate thereof, made of glass epoxy resin, ceramic, or glass. The wiring patterns 15 are formed of copper or gold, or composed of an indium tin oxide (ITO) film, or so forth for use in a liquid crystal display panel, and the like.

An operation of mounting a semiconductor device comprises the following steps.

First, as shown in FIG. 11, the anisotropic conductive adhesive 13 is transferred onto a part of the circuit board 17 where the semiconductor device 16 is to be connected.

In a next step, as shown in FIG. 12, the semiconductor device 16 is placed on the circuit board 17 disposed opposite thereto, after aligning the respective wiring patterns 15 provided on the circuit board 17 with the respective bumps 14 formed on the semiconductor device 16.

Subsequently, the semiconductor device 16 is thermally press-bonded to the circuit board 17 by heating the semiconductor device 16 while applying a pressure P thereto by use of a heating and pressurizing tool 18 provided with a built-in heater as shown in FIG. 13, thereby curing the adhesive resin 11 contained in the anisotropic conductive adhesive 13.

Then, as shown in FIG. 14, upon curing of the adhesive resin 11, the semiconductor device 16 is bonded to, and fixed to the surface of the circuit board 17, so that electric conduction is maintained between the respective bumps 14 of the semiconductor device 16, and the respective wiring patterns 15 through the intermediary of the conductive particles 12 contained in the anisotropic conductive adhesive 13.

With this method of mounting the semiconductor device, a thermal press-bonding process proceeds from the outset at a temperature required for curing the adhesive resin 11 by use of the heating and pressurizing tool 18, however, the adhesive resin 11 of the thermosetting type, such as an epoxy based adhesive, and so forth, softens up rapidly when heated to more than a certain temperature, and is turned into a half-fusion state. Thereafter, a curing reaction proceeds, thereby curing the adhesive resin 11. FIGS. 15 and 16 are enlarged views showing conditions of a structure for mounting the semiconductor device before, and after the thermal press-bonding process, respectively.

FIG. 15 shows the condition when the semiconductor device 16 is placed on the circuit board 17, that is, the condition before heating and pressurizing are carried out by use of the heating and pressurizing tool 18 as shown in FIG. 13, showing an enlarged view of a part of the semiconductor device 16, and the circuit board 17, respectively, so as to illustrate with clarity the state of the conductive. particles 12 existing between the bumps 14 and the wiring patterns 15. At this point in time, preceding the heating and pressurizing, the adhesive resin 11 remains in the film-like shape as transferred.

Subsequently, as shown in FIG. 16, when a pressure P is applied to the semiconductor device 16 while applying heat thereto a temperature at which curing reaction occurs to the adhesive resin 11 by use of the heating and pressurizing tool 18 in order to cause the adhesive resin 11 to be cured, the adhesive resin 11 is cured rapidly, and at the same time, is crushed and fluidized, thereby being forced out of under the semiconductor device 16. Since a spacing between the respective bumps 14 and the respective wiring patterns 15 is narrowed down to a minimum, portions of the adhesive resin 11, in the vicinity of the respective bumps 14, is forcefully pushed out by the respective bumps 14, and are fluidized at the maximum.

Along with the adhesive resin 11, which has been fluidized, the conductive particles 12 are also pushed out outside under the respective bumps 14, and consequently, when the thermal press-bonding process is completed upon curing of the adhesive resin 11 later on, many of the conductive particles 12 will be found to be present in regions lying off the bottom face of the respective bumps 14. Accordingly, there will remain only a few of the conductive particles 12 between the respective bumps 14 and the respective wiring patterns 15.

Thus, a problem has been encountered with the conventional method of mounting the semiconductor device in that connecting resistance between the respective bumps 14 and the respective wiring patterns 15 became high because of a temporary softening phenomenon occurring to the adhesive resin 11 of the anisotropic conductive adhesive 13 prior to curing thereof caused by heating during the thermal press-bonding process, and pushing out of the conductive particles 12 and a decrease in the number of the conductive particles 12 left out between the respective bumps 14 and the respective wiring patterns 15 caused by pressurizing force applied to the semiconductor device.

In order to hold down the connecting resistance at a low level, it is required that as many as possible of the conductive particles 12 are left out between the respective bumps 14 and the respective wiring patterns 15. To this end, it is necessary to expand an area of a connecting region where both the parts described are to be connected with each other so that many of the conductive particles 12 can be arrested therebetween.

However, in order to implement high-density mounting, it is necessary to reduce an area of the connecting region, thereby rendering it difficult to arrest many of the conductive particles 12 between the respective bumps 14 and the respective wiring patterns 15. Consequently, the number of the conductive particles 12 left out in the connecting region will become fewer. Accordingly, the conventional method of mounting the semiconductor device described in the foregoing is unsuitable for high-density mounting because a connecting resistance value becomes high, and connection tends to become unstable.

The invention has been developed to solve such a problem as described above with the conventional method of mounting the semiconductor device using the anisotropic conductive adhesive, and it is therefore an object of the invention to enable stable connection to be effected at low connecting resistance even if the area of the connecting region is small by increasing the number of conductive particles arrested between the respective bumps of the semiconductor device and the respective wiring patterns of the circuit board, thereby rendering the method suitable for high-density mounting.

DISCLOSURE OF THE INVENTION

To this end, the method of mounting a semiconductor device using an anisotropic conductive adhesive, according to the invention, comprises the following steps (1) to (4).

(1) a step of disposing the anisotropic conductive adhesive, composed of conductive particles mixed in an adhesive resin of a thermosetting type, in a region on the surface of a circuit board, where wiring patterns are formed;

(2) a step of placing the semiconductor device on the surface of the circuit board after aligning bumps provided on the semiconductor device with the wiring patterns formed on the surface of the circuit board, respectively;

(3) a step of provisionally press-bonding the semiconductor device onto the circuit board by applying a predetermined pressure thereto at a temperature lower than the curing temperature of the adhesive resin of the anisotropic conductive adhesive; and (4) a step of bonding the semiconductor device, as provisionally press-bonded, onto the circuit board by curing the adhesive resin at a temperature causing the adhesive resin to be cured.

With the method of mounting the semiconductor device as described above, electric conduction is preferably effected between the bumps of the semiconductor device and the wiring patterns of the circuit board, respectively, in the step of provisionally press-bonding the semiconductor device onto the circuit board.

Further, the step described under (4) may be performed by means of thermal press-bonding using a heating and pressurizing tool set at a temperature causing the adhesive resin to be cured.

Otherwise, the step described under (4) may be performed by placing the circuit board with the semiconductor device provisionally press-bonded thereto in a furnace set at a temperature causing the adhesive resin to be cured, or by placing the circuit board with the semiconductor device provisionally press-bonded thereto on a hot plate set at the temperature causing the adhesive resin to be cured.

Further, with the method of mounting the semiconductor device, the conductive particles are preferably brought into contact with the bumps of the semiconductor device and the wiring patterns of the circuit board, respectively.

With the method of mounting the semiconductor device according to the invention, since provisional press-bonding is effected at a temperature at which the adhesive resin of the anisotropic conductive adhesive remains in a condition of low fluidity in mounting the semiconductor device on the circuit board, the conductive particles are held sandwiched between the respective bumps and the respective wiring patterns while the adhesive resin is in a condition of high viscosity, so that a large number of the conductive particles are left out therebetween. As final curing of the adhesive resin is effected thereafter, it is possible to achieve a stable connection at a low connecting resistance with many of the conductive particles remaining in the connecting region. Furthermore, since many of the conductive particles can be left out in the connecting region, it is possible to reduce the area of the connecting region, thereby enabling connection to be realized at a still finer connection pitch than before.

BEST MODE FOR CARRYING OUT THE INVENTION

Figure 1:
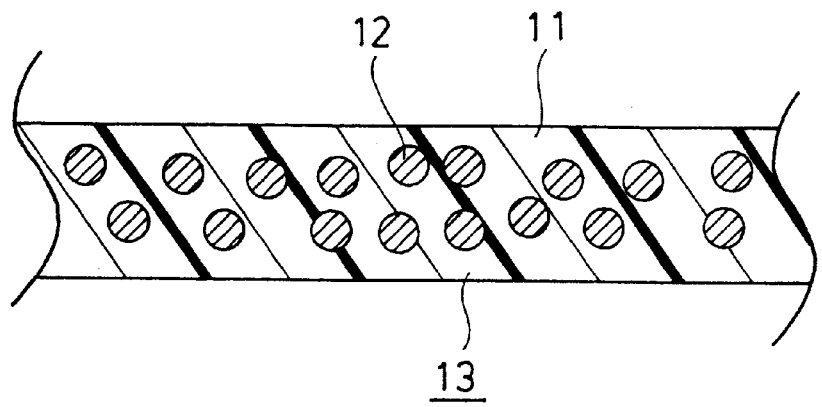
FIG. 1 is an enlarged schematic sectional view showing a part of an anisotropic conductive adhesive for use in a method of mounting a semiconductor device according to the invention.

Preferred embodiments of a method of mounting a semiconductor device according to the invention are described in detail hereinafter with reference to FIGS. 1 to 10. In these figures, parts corresponding to those of the conventional example shown in FIGS. 11 to 16 are denoted by same reference numerals.

FIG. 1 is an enlarged schematic sectional view showing a part of an anisotropic conductive adhesive for use in the method of mounting the semiconductor device according to the invention. The anisotropic conductive adhesive is formed in a film-like shape before use on top of a base film, and a surface of the opposite side thereof is protected by a cover film although illustration thereof is omitted. The anisotropic conductive adhesive 13 is composed of a multitude of conductive particles 12 in the range of 3 to several tens of μm in diameter which are mixed in a film of an adhesive resin 11, in the order of 15 to 100 μm in thickness, having a construction provided with electric conductivity in thickness direction.

Figure 6:
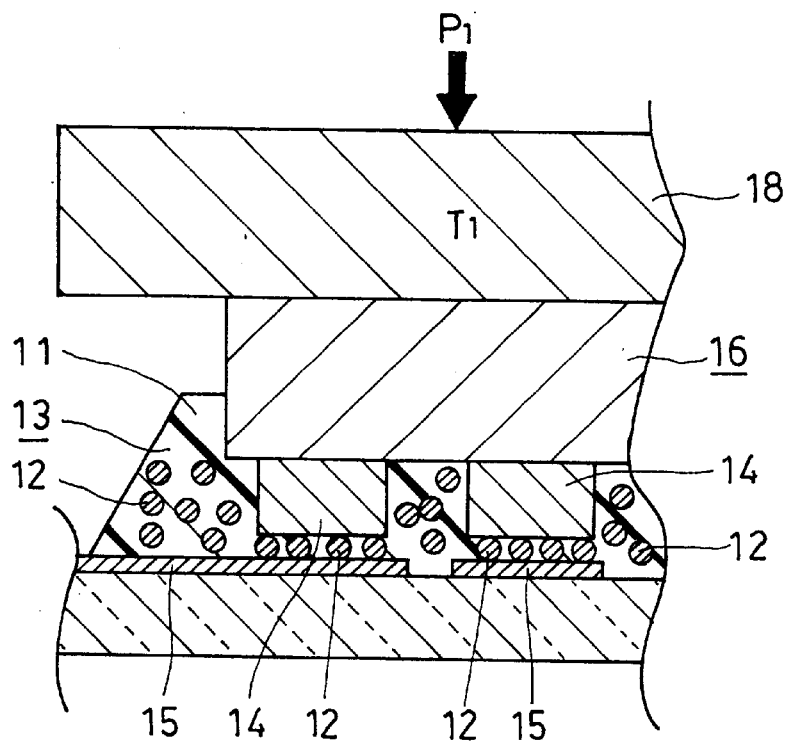
FIGS. 6 and 7 are enlarged schematic sectional views of a principal part of the steps shown in FIGS. 3 and 4, respectively.

The film of the adhesive resin 11 is set to a thickness in the order of 15 to 100 μm, however, a specific thickness thereof is decided upon according to a height (height from a substrate) of bumps 14 formed on a semiconductor device 16 to be mounted and a height (height from a substrate) of wiring patterns 15 provided on a circuit board 17, as shown in FIG. 6 and so forth. For example, on the assumption that the bumps are 20 μm in height, and the wiring pattern is 18 μm in height, the film of the adhesive resin 11 needs to have a thickness in excess of a height (thickness) equivalent to the sum of heights of both elements described, and accordingly, is set to have a thickness of 38 μm or more, that is, the sum of both the elements.

Further, the adhesive resin is formed in a film-like shape by the printing method or the transfer method, however, in practice, the film of the adhesive resin is formed to a thickness thicker by about 10 μm than the thickness described above, taking into account accuracy in forming the same. Accordingly, in the above-mentioned case, the film of the adhesive resin 11 is formed to a thickness in the order of 50 μm, thicker by about 10 μm than 38 μm.

For the adhesive resin 11, an insulating and thermosetting resin such as an epoxy resin, a phenolic resin, and so forth, for example, an epoxy based thermosetting resin, is used.

The conductive particles 12 to be mixed in the adhesive resin 11 are in the range of 3 to several tens of μm in diameter, and are metallic particles made of silver or solder, or resin particles made of a plastic, with gold (Au) plating applied on the surface thereof.

The diameter of the conductive particles 12 varies depending on a gap (spacing) between the wiring patterns 15 to which the bumps are to be connected, respectively. For example, if the gap is 10 μm, the diameter of the conductive particles 12 is set at no more than 10 μm in order to prevent short-circuiting from occurring between the wiring patterns 15. The conductive particles 12 in an amount of 4 wt % (% by weight) are added to the adhesive resin 11, and a mixture is tempered, thereby forming the anisotropic conductive adhesive 13.

Figure 2:
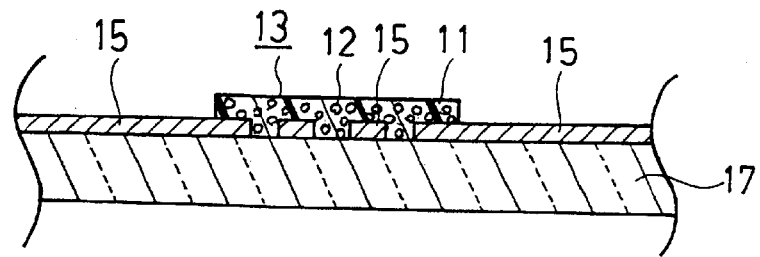
FIGS. 2 to 5 are schematic sectional views showing respective steps in sequence of an embodiment of the method of mounting the semiconductor device according to the invention.

The circuit board 17 shown in FIG. 2 and subsequent figures is provided with the wiring patterns 15 formed on a substrate thereof, made of a glass epoxy resin, ceramic, or glass. The wiring patterns 15 are formed of copper or gold, or composed of an indium tin oxide (ITO) film, or so forth for use in a liquid crystal display panel, and the like.

An operation of mounting the semiconductor device 16 on the circuit board 17 comprises the following steps.

In this case of the method of mounting the semiconductor device, the same as the conventional method, the respective wiring patterns 15 provided on the circuit board 17 are connected with the respective bumps 14 formed on the semiconductor device 16. When making such a connection, the conductive particles 12 having electric conductivity are sandwiched between the respective wiring patterns 15 and the respective bumps 14, thereby effecting electric conduction therebetween by the agency of the conductive particles 12. The bumps 14 are formed by the plating method, the vacuum deposition method, or so forth, using material such as solder, gold, or copper.

First, as shown in FIG. 2, the anisotropic conductive adhesive 13 is disposed by the transfer method and so forth on a region of the surface of the circuit board 17 where the wiring patterns on which the semiconductor device 16 is to be mounted are formed. The anisotropic conductive adhesive 13 is disposed so as to be equivalent in planar size to the semiconductor device 16 to be mounted, or so as to be spread in a range larger (wider) by about 2 mm than the outer dimensions of the semiconductor device 16, around the entire periphery thereof.

When transferring the anisotropic conductive adhesive 13 formed on the base film, the anisotropic conductive adhesive 13 is cut beforehand so as to match with a transfer region where the same is to be transferred, and the anisotropic conductive adhesive 13 as cut is disposed in the transfer region.

Subsequently, transfer of the anisotropic conductive adhesive 13 onto the circuit board 17 is implemented through thermal press-bonding of the anisotropic conductive adhesive 13, as disposed above, with the use of a heating head (not shown) heated up by a heater to a temperature in the range of about 80 to 100° C. Pressure of a magnitude enabling the anisotropic conductive adhesive 13 just to be pasted to the circuit board 17 may be sufficient as a pressure to be applied at this point in time. Thereafter, the base film is peeled off.

Figure 3:
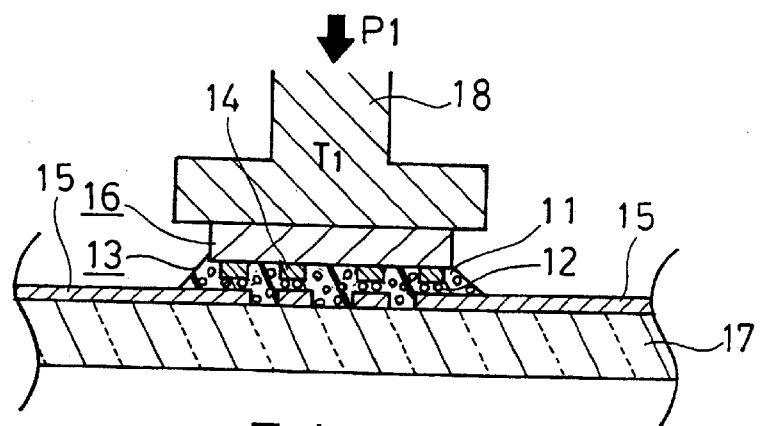

Next, as shown in FIG. 3, the semiconductor device 16 is placed on the surface of the circuit board 17 after aligning the respective wiring patterns 15 provided on the circuit board 17 with the respective bumps 14 formed on the semiconductor device 16. Subsequently, provisional mounting of the semiconductor device 16 is implemented in a step of thermal press-bonding (referred to hereinafter as provisional press-bonding) of the semiconductor device 16 onto the circuit board 17 at a temperature $T_1$ lower than a temperature (referred to as curing temperature) at which the adhesive resin 11 of the anisotropic conductive adhesive 13 starts undergoing curing reaction while applying a predetermined pressure $P_1$ to the semiconductor device 16 from the side of the rear face thereof where the bumps 14 are not formed, by use of a heating and pressurizing tool 18 provided with a built-in heater.

The heating and pressurizing tool 18 has a construction wherein both the heater and a thermocouple are installed, so that heating is provided by the heater while temperature can be controlled by the thermocouple.

The provisional press-bonding is effected at a temperature at which the adhesive resin 11 can remain in a condition of low fluidity and high viscosity. Such a temperature is a temperature lower than the curing temperature of the adhesive resin 11 of the anisotropic conductive adhesive 13, and more specifically, is in the range of about 30 to 80° C.

The pressure $P_1$ at the time of the provisional press-bonding is applied to the area of a connecting region on the bumps 14 in the order of 200 to 1000 kg/cm². The pressure applied at the time of the provisional press-bonding is preferably pressure of a magnitude causing the conductive particles 12 contained in the anisotropic conductive adhesive 13 to come just in contact with the bumps 14 of the semiconductor device 16, and the wiring patterns 15 of the circuit board 17, respectively, thereby effecting electric conduction therebetween.

At this point in time, the adhesive resin has such low fluidity as to allow the same to soften up a little, and is not prone to flow out between the bumps 14 and the wiring patterns 15, so that a multitude of the conductive particles 12 can be held sandwiched therebetween.

Figure 4:
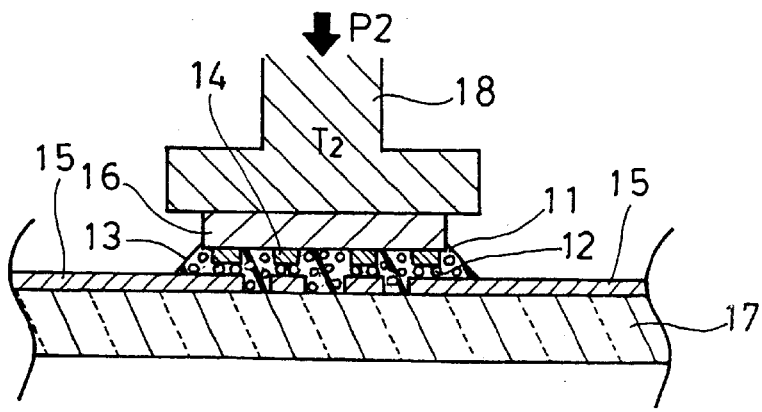

Subsequently, as shown in FIG. 4, heating is applied at a temperature $T_2$ ($T_2<T_1$) higher than the curing temperature of the adhesive resin 11 of the anisotropic conductive adhesive 13 while applying a pressure $P_2$ by use of the heating and pressurizing tool 18.

In this case, if epoxy resin is used for the adhesive resin 11, the temperature $T_2$ at which heating is applied is set in the range of about 150 to 250° C., and the heating is applied for the duration of 5 to 30 seconds. Further, the pressure $P_2$ is applied to an area of the connecting region on the bumps 14 of the semiconductor device 16 is in the order of 200 to 1000 kg/cm$^2$. The pressure $P_2$ may differ from the pressure $P_1$ applied at the time of the provisional press-bonding, and is preferably higher than the pressure $P_1$ ($P_1<P_2$).

Figure 5:
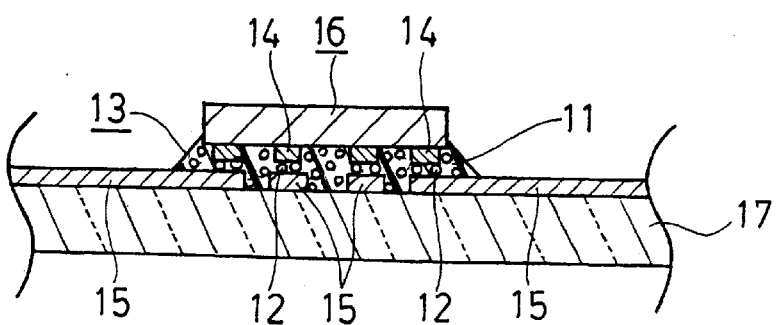

When a heating and pressurizing process is applied at the temperature $T_2$ as described above by use of the heating and pressurizing tool 18, the adhesive resin 11 of the anisotropic conductive adhesive 13 softens up once, and is turned into a half-fusion state, however, the conductive particles 12 will not flow out since the same are held sandwiched between the respective bumps 14 and the respective wiring patterns 15. Thereafter, as the curing reaction proceeds, causing the adhesive resin 11 to be cured, the semiconductor device 16 is bonded to the circuit board 17 as shown in FIG. 5, so that electric conduction between the respective bumps 14 of the semiconductor device 16 and the respective wiring patterns 15 can be maintained with certainty by the agency of a plurality of the conductive particles 12 held sandwiched therebetween.

Thus, with the method of mounting the semiconductor device according to the invention, the semiconductor device is mounted by carrying out a heating and pressurizing process applied in two stages whereby the adhesive resin 11 is cured after the provisional press-bonding is applied. Consequently, the following effect, differing from that for the conventional case, can be brought about. The effect is described hereinafter with reference to FIGS. 6 and 7.

Figure 7:
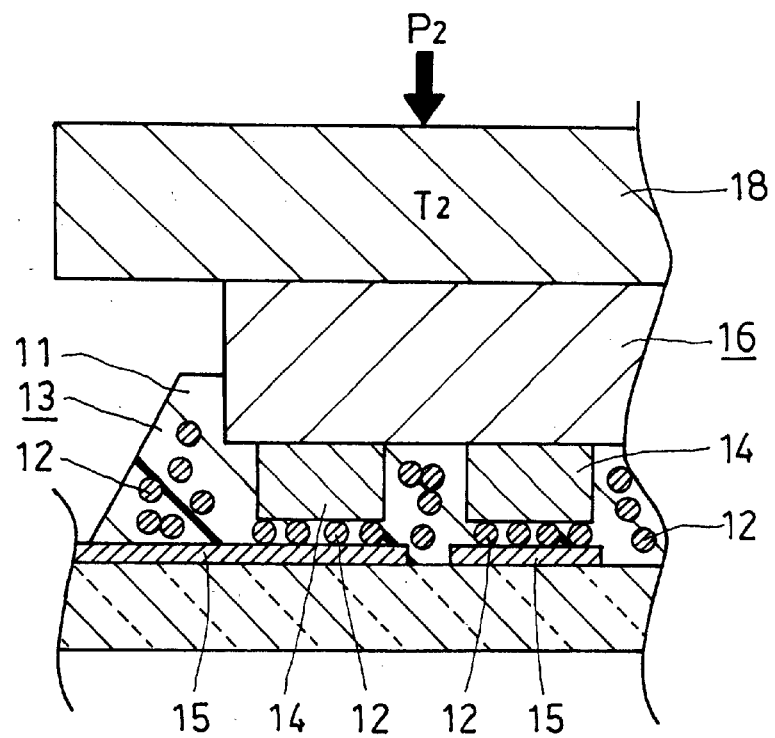

FIGS. 6 and 7 are enlarged schematic sectional views of a principal part of the steps shown in FIGS. 3 and 4, respectively, for illustrating with clarity the state of the conductive particles 12 sandwiched between the respective bumps 14 and the respective wiring patterns 15. As described above, with the method according to the invention, sufficient pressurizing is applied beforehand through the preceding step of provisional press-bonding as shown in FIG. 6 in mounting the semiconductor device 16 on the circuit board 17, unlike the conventional method whereby a pressurizing and heating and press-bonding process for curing the adhesive resin 11 of the anisotropic conductive adhesive 13 is carried out at a time.

Accordingly, by the time when the heating and pressurizing process for curing the adhesive resin 11 is applied as shown in FIG. 7, the conductive particles 12 have already been held sandwiched between the respective bumps 14 and the respective wiring patterns 15 (4 pieces thereof in the figure). Accordingly, even if heating for curing the adhesive resin 11 is applied subsequently, the conductive particles 12 remain sandwiched between the respective bumps 14 and the respective wiring patterns 15, and will not flow outside of the respective bumps 14 even if the adhesive resin 11 becomes fluidized. This makes it possible to arrest more of the conductive particles 12 between the respective bumps 14 and the respective wiring patterns 15 while keeping the same in contact with both the respective bumps 14 and the respective wiring patterns 15. As the conductive particles 12 undergo deformation to some extent when sandwiched between the respective bumps 14 and the respective wiring patterns 15, a contact area of the conductive particles 12 with the respective bumps 14 and the respective wiring patterns 15, respectively, becomes wider, thereby improving electric conduction, and lowering connecting resistance.

Figure 8:
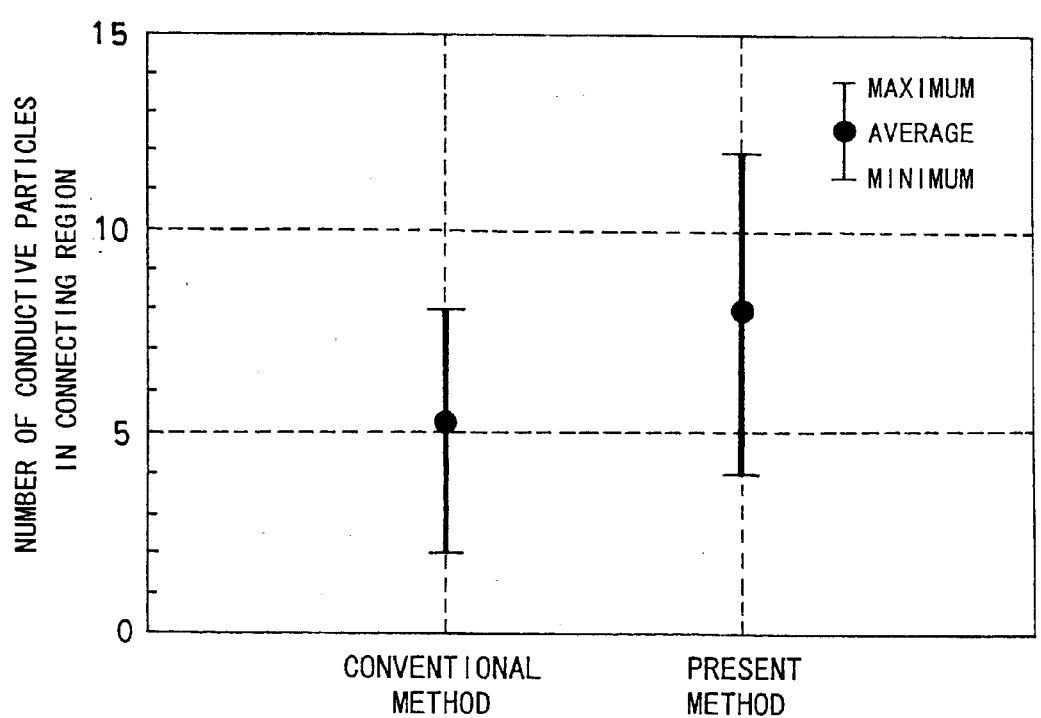
FIG. 8 is a diagram showing the number of conductive particles existing between respective bumps of the semiconductor device mounted by the method of mounting the semiconductor device according to the invention, and respective wiring patterns of a circuit board, as compared with that in the case of the conventional example.

Now, FIG. 8 shows the number of the conductive particles existing between the respective bumps and the respective wiring patterns in the case of mounting a semiconductor device using the method of mounting the same according to the invention in comparison with that in the case of mounting a semiconductor device using the conventional method of mounting the same. In the figure, the vertical axis represents the number of the conductive particles. The figure shows that in the case of mounting the semiconductor device using the method of mounting the same according to the invention, there exist 8 pieces on average of the conductive particles while with the conventional method of mounting the semiconductor device, there exist about 5.5 pieces on average of the conductive particles. It is thus shown that, with the method of mounting the semiconductor device according to the invention, a greater number of the conductive particles remain in a connecting region between the respective bumps and the respective wiring patterns.

In this case, the semiconductor device was mounted on a glass board by the method of mounting the same according to the invention, and by the conventional method of mounting the same, respectively, so as to be able to observe the connecting region, and the number of the conductive particles remaining in the connecting region was measured in respective cases.

Figure 9:
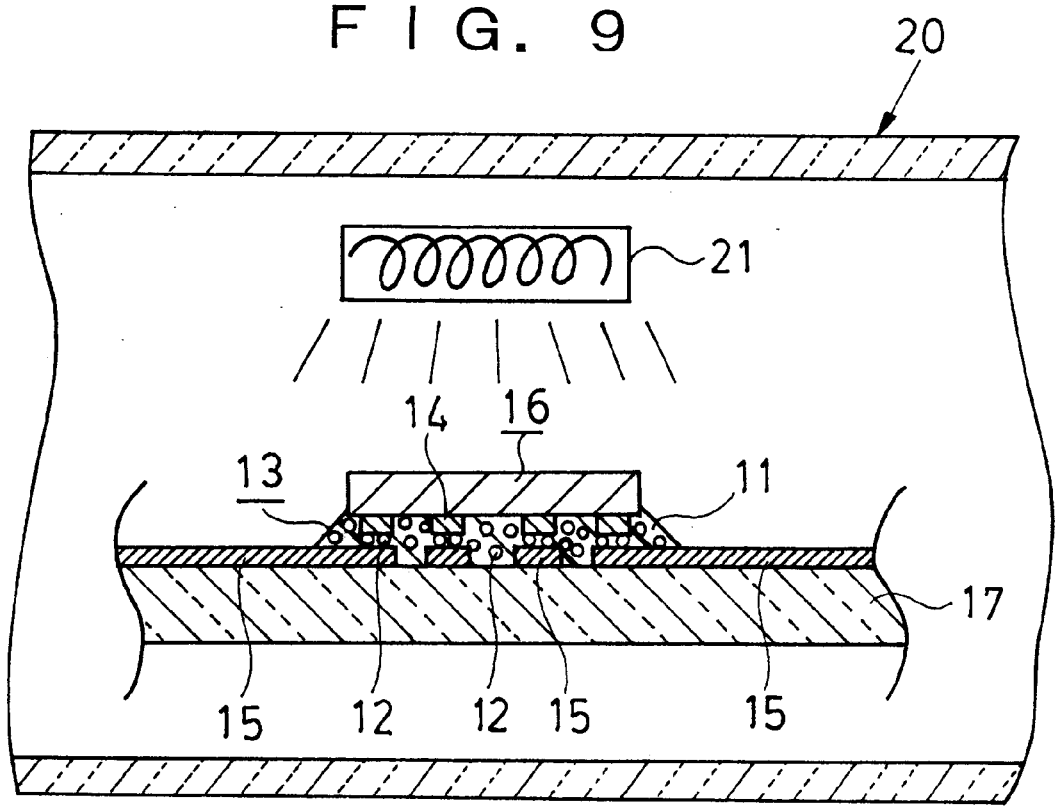
FIG. 9 is a schematic sectional view showing an example of another step substituted for the step of the method of mounting the semiconductor device according to the invention, shown in FIG. 4.

With the above-described embodiment of the invention, the step of fully curing the adhesive resin 11 of the anisotropic conductive adhesive 13 is carried out by applying the heating and pressurizing process using the heating and pressurizing tool 18, however, as shown in FIG. 9, the step described above may be carried out by placing the circuit board 17 with the semiconductor device 16 provisionally press-bonded thereto in a furnace 20 set at a temperature causing the adhesive resin 11 to be cured, in the range of 150 to 250° C., and by subsequently supplying heat from a heat source 21 of the furnace 20.

Figure 10:
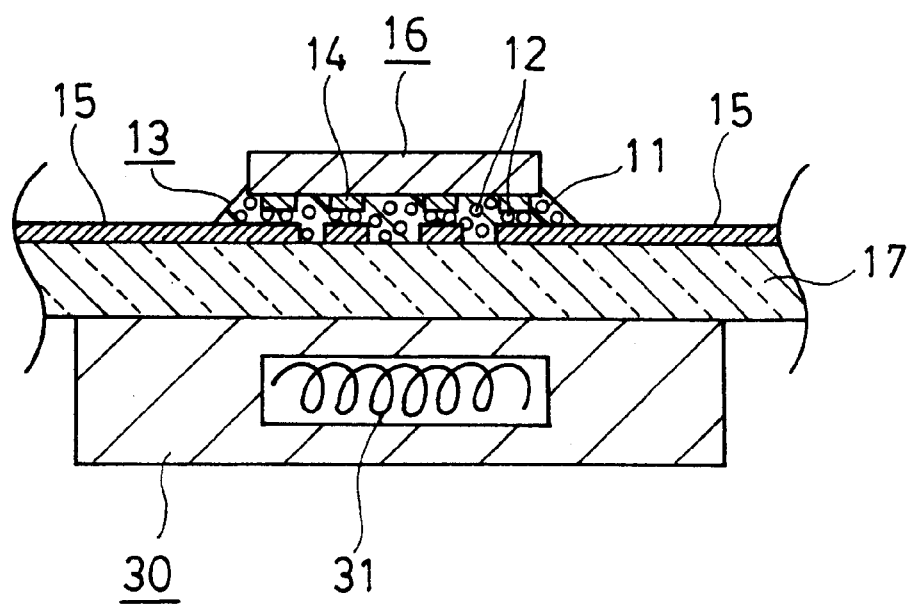
FIG. 10 is a schematic sectional view showing an example of still another step substituted for the step of the method of mounting the semiconductor device according to the invention, shown in FIG. 4.
Figure 11:
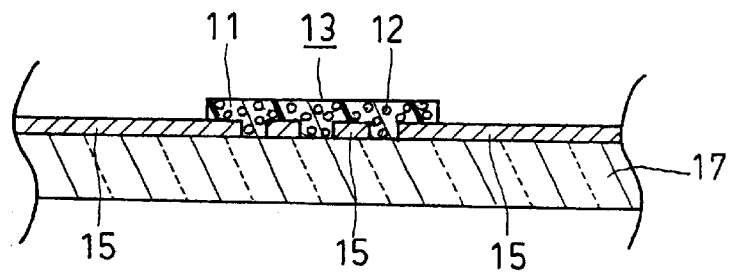
FIGS. 11 to 14 are schematic sectional views showing respective steps in sequence of the conventional method of mounting a semiconductor device.
Figure 12:
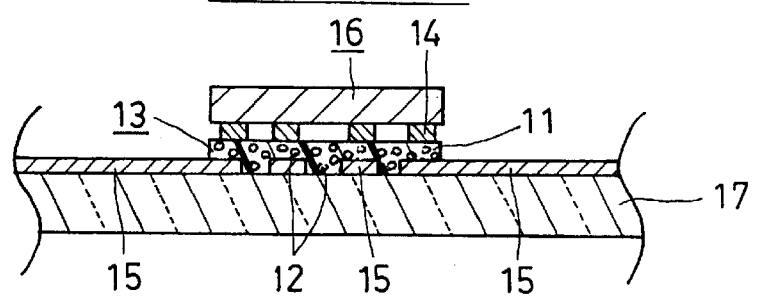
Figure 13:
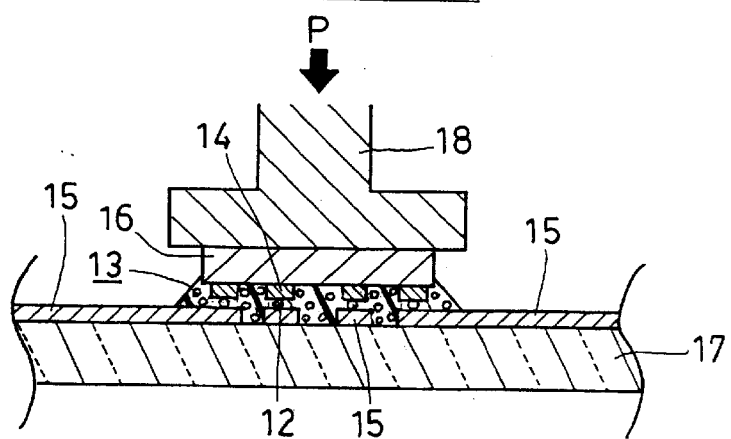
Figure 14:
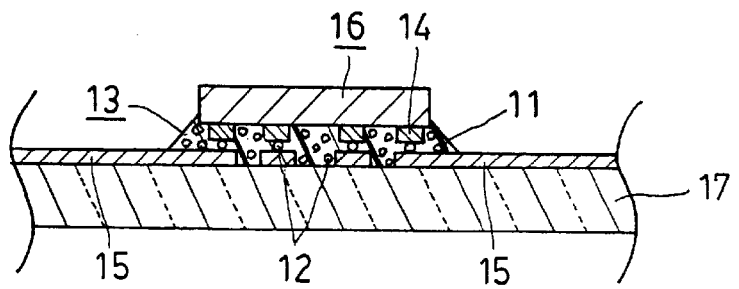
Figure 15:
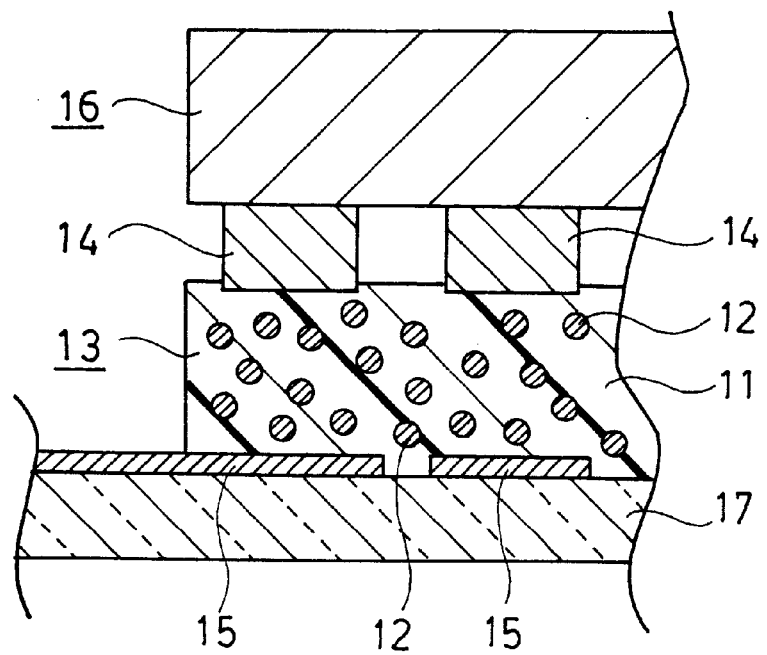
FIGS. 15 and 16 are enlarged schematic sectional views of a principal part of the steps shown in FIGS. 12 and 13, respectively.
Figure 16:
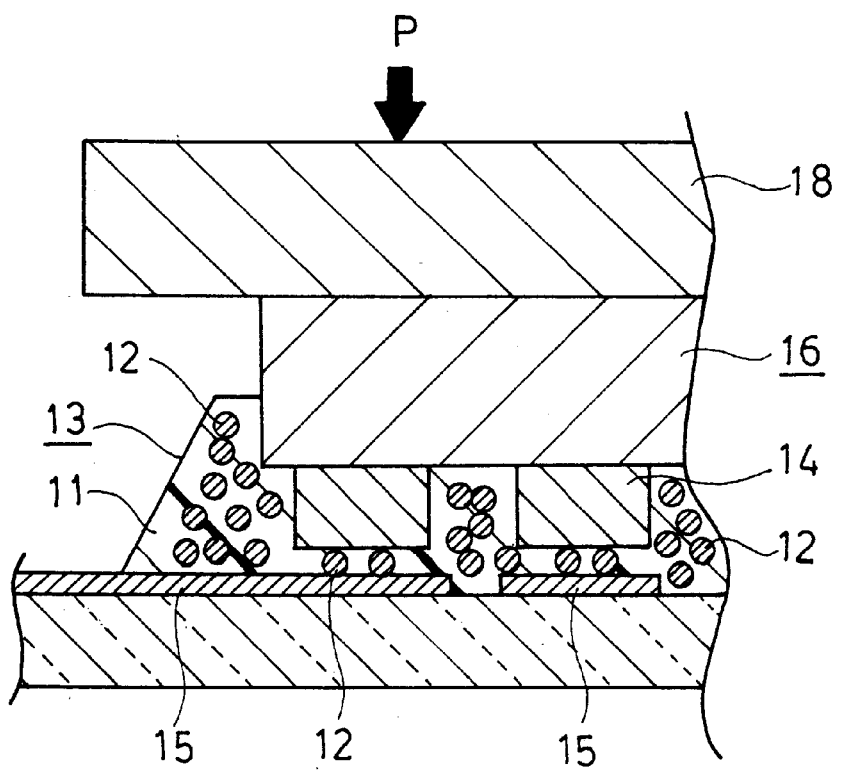

Otherwise, as shown in FIG. 10, the step described above may be carried out by placing the circuit board 17 with the semiconductor device 16 provisionally press-bonded thereto on top of a hot plate 30 set at a temperature causing the adhesive resin 11 to be cured, in the range of 150 to 250° C., and by heating for a duration of about 5 to 30 seconds. The hot plate 30 is provided with a built-in heater 31.

INDUSTRIAL APPLICABILITY

With the method of mounting the semiconductor device according to the invention, in effecting thermal press-bonding of the semiconductor device onto the circuit board by use of the anisotropic conductive adhesive, provisional press-bonding is applied at a temperature at which the adhesive resin has low fluidity, prior to curing of the anisotropic conductive adhesive, so that a large number of the conductive particles can be held sandwiched between the respective bumps and the respective wiring patterns. This makes it possible to attain stable connection at a low connecting resistance value, thereby enabling the semiconductor device to be mounted with high connection reliability.

Furthermore, since it is possible to leave out more of the conductive particles in the connecting region, an area of the connecting region can be reduced while maintaining the same connecting resistance value as before. Accordingly, with the method of mounting according to the invention, connection to finer wiring patterns becomes possible so as to be adaptable for high-density mounting.

What is claimed is:

1. A method of mounting a semiconductor device using an anisotropic conductive adhesive, comprising:

a step of disposing the anisotropic conductive adhesive, composed of conductive particles mixed in an adhesive resin of a thermosetting type, in a region on the surface of a circuit board, where wiring patterns are formed;

a step of placing the semiconductor device on the surface of the circuit board after aligning bumps provided on the semiconductor device with the wiring patterns formed on the surface of the circuit board, respectively;

a step of provisionally press-bonding the semiconductor device onto the circuit board by applying a first pressure thereto in order to bring the conductive particles into contact with the bumps and the wiring patterns at a temperature lower than the curing temperature of the adhesive resin of the anisotropic conductive adhesive;

a step of press-bonding the provisionally press-bonded semiconductor device onto the circuit board by applying a second pressure thereto which is higher than the first pressure; and a step of bonding the semiconductor device. as provisionally press-bonded, onto the circuit board by curing the adhesive resin at a temperature causing the adhesive resin to be cured.

2. A method of mounting a semiconductor device using an anisotropic conductive adhesive according to claim 1, wherein electric conduction is effected between the bumps of the semiconductor device and the wiring patterns of the circuit board, respectively, in the step of provisionally press-bonding the semiconductor device onto the circuit board.

3. A method of mounting a semiconductor device using an anisotropic conductive adhesive according to claim 1, wherein the step of bonding the semiconductor device, as press-bonded, onto the circuit board is performed by means of thermal press-bonding using a heating and pressurizing tool set at a temperature causing the adhesive resin to be cured.

4. A method of mounting a semiconductor device using an anisotropic conductive adhesive according to claim 1, wherein the step of bonding the semiconductor device, as press-bonded, onto the circuit board is performed by placing the circuit board with the semiconductor device press-bonded thereto in a furnace set at a temperature causing the adhesive resin to be cured.

5. A method of mounting a semiconductor device using a anisotropic conductive adhesive according to claim 1, wherein the step of bonding the semiconductor device as press-bonded, onto the circuit board is performed by placing the circuit board with the semiconductor device press-bonded thereto on a hot plate set at a temperature causing the adhesive resin to be cured.

6. A method of mounting a semiconductor device using a anisotropic conductive adhesive according to claim 1, wherein the step of bonding the semiconductor device, as press-bonded, onto the circuit board is performed by placing the circuit board with the semiconductor device press-bonded thereto in a furnace set at a temperature causing the adhesive resin to be cured.

* * * * *

UNITED STATES PATENT AND TRADEMARK OFFICE
CERTIFICATE OF CORRECTION

PATENT NO. : 6,498,051 B1
DATED : December 24, 2002
INVENTOR(S) : Makoto Watanabe It is certified that error appears in the above-identified patent and that said Letters Patent is hereby corrected as shown below:

Column 10,
Lines 20 and 27, change "using a" to be -- using an --
Line 28, change "claim 1" to be -- claim 2 --

Signed and Sealed this

First Day of July, 2003

JAMES E. ROGAN
*Director of the United States Patent and Trademark Office*